(12) United States Patent
Chung

(10) Patent No.: US 8,169,846 B2
(45) Date of Patent: May 1, 2012

(54) REFRESH CONTROL CIRCUIT AND METHOD FOR SEMICONDUCTOR MEMORY APPARATUS

(75) Inventor: Won Kyung Chung, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 303 days.

(21) Appl. No.: 12/651,043

(22) Filed: Dec. 31, 2009

(65) Prior Publication Data

US 2010/0232246 A1   Sep. 16, 2010

(30) Foreign Application Priority Data

Mar. 13, 2009   (KR) .................. 10-2009-0021610

(51) Int. Cl.
*G11C 7/04*   (2006.01)
(52) U.S. Cl. .................. 365/211; 365/185.25
(58) Field of Classification Search .................. 365/211, 365/185.25
See application file for complete search history.

(56) References Cited

U.S. PATENT DOCUMENTS

| 7,038,968 | B2 | 5/2006 | Kim |
| 7,120,549 | B2 | 10/2006 | Lee |
| 7,164,614 | B2 | 1/2007 | Kim |
| 2007/0145578 | A1 | 6/2007 | Lee |
| 2008/0169860 | A1 | 7/2008 | Song |
| 2009/0058539 | A1 | 3/2009 | Hong |
| 2009/0326843 | A1* | 12/2009 | Song .............................. 702/65 |

FOREIGN PATENT DOCUMENTS

| JP | 01-205788 | 8/1989 |
| KR | 10-2007-0118359 A | 12/2007 |
| KR | 10-2008-0020920 A | 3/2008 |

* cited by examiner

*Primary Examiner* — Jason Lappas
(74) *Attorney, Agent, or Firm* — William Park & Associates Ltd.

(57) ABSTRACT

A refresh control circuit of a semiconductor memory apparatus includes: a variable oscillator configured to generate a room-temperature oscillation signal and a limit-temperature oscillation signal in response to a temperature state signal; a cycle selector configured to selectively output the room temperature oscillation signal and the limit-temperature oscillation signal as a variable oscillation signal in response to the temperature state signal; a refresh signal generator configured to generate a refresh signal in response to the variable oscillation signal and a fixed oscillation signal; and a temperature state detector configured to generate the temperature state signal by detecting current temperature in response to the room-temperature oscillation signal and the fixed oscillation signal.

15 Claims, 3 Drawing Sheets

REFRESH CONTROL CIRCUIT AND METHOD FOR SEMICONDUCTOR MEMORY APPARATUS

CROSS-REFERENCES TO RELATED APPLICATION

The present application claims priority to Korean Application No. 10-2009-0021610, filed on Mar. 13, 2009, which is incorporated by reference in its entirety as if set forth in full.

BACKGROUND

1. Technical Field

Various embodiments of the present disclosure generally relate to a semiconductor memory apparatus, and more particularly, to a circuit and method controlling a refresh period in a semiconductor memory apparatus.

2. Related Art

A dynamic random access memory (DRAM), as one of semiconductor memories, has a memory cell consisting of a single cell transistor and a single cell capacitor. The DRAM cell is volatile in nature in that data stored in its cell capacitor—a state of high or low level—cannot be retained unless power is not supplied.

Even with a constant power supply, a DRAM cell is incapable of retaining data in the cell capacitor due to leakage factors such as leakage currents. Thus, an extra operation, i.e., a refresh operation, should be provided to periodically re-write data into the DRAM cell for continuous retention of data.

For such functionalities, a DRAM is generally equipped with a refresh control circuit to control the refresh operation. This refresh control circuit generates a refresh signal that is activated (oscillates or toggles) in a predetermined cycle. Meanwhile, a high temperature typically adversely affects the data retention capability of a semiconductor memory cell because the threshold voltage of the cell transistor goes down as temperature rises. But, data retention capability of a semiconductor memory cell is enhanced in a low temperature, because a threshold voltage of the cell transistor becomes higher in proportion to a drop of temperature. For that reason, a refresh control circuit is typically designed to reduce the activation cycle of the refresh signal (a refresh cycle, which is the interval between refresh operations) as temperature rises, or to extend the refresh cycle as temperature drops.

Typical refresh control circuits are configured considering only room temperature as a variable (typically, 0° C.-100° C.). While a refresh cycle linearly varies in room temperatures between 0° C. to 100° C., in temperature conditions outside the range of room temperature (0° C.-100° C.), the refresh cycles are set to fixed values, without adaptive variations. As a result, when a DRAM is operating under cool temperature (typically, under 0° C.), current dissipation inadvertently occurs due to an improper refresh cycle that is shorter than needed. On the other hand, when a DRAM is operating under hot temperature (typically, over 100° C.), an excessively long refresh cycle results in data loss.

SUMMARY OF THE INVENTION

In one aspect of the present invention, a refresh control circuit of a semiconductor memory apparatus includes: a variable oscillator configured to generate a room-temperature oscillation signal and a limit-temperature oscillation signal in response to a temperature state signal; a cycle selector configured to selectively output the room-temperature oscillation signal or the limit-temperature oscillation signal as a variable oscillation signal in response to the temperature state signal; a refresh signal generator configured to generate a refresh signal in response to the variable oscillation signal and a fixed oscillation signal; and a temperature state detector configured to generate the temperature state signal by detecting current temperature in response to the room-temperature oscillation signal and the fixed oscillation signal.

In another aspect of the present invention, a refresh control method of a semiconductor memory apparatus is comprised of: determining whether current temperature is in a room temperature or in a limit temperature zone; oscillating a limit-temperature oscillation signal in a linear cycle variation if current temperature is in the limit temperature zones; and generating a refresh signal by means of the limit-temperature oscillation signal and a fixed oscillation signal.

BRIEF DESCRIPTION OF THE DRAWINGS

Features, aspects, and embodiments are described in conjunction with the attached drawings, in which.

DETAILED DESCRIPTION

Hereinafter, various aspects of the present invention will be described in detail with reference to the accompanying drawings.

Figure 1:
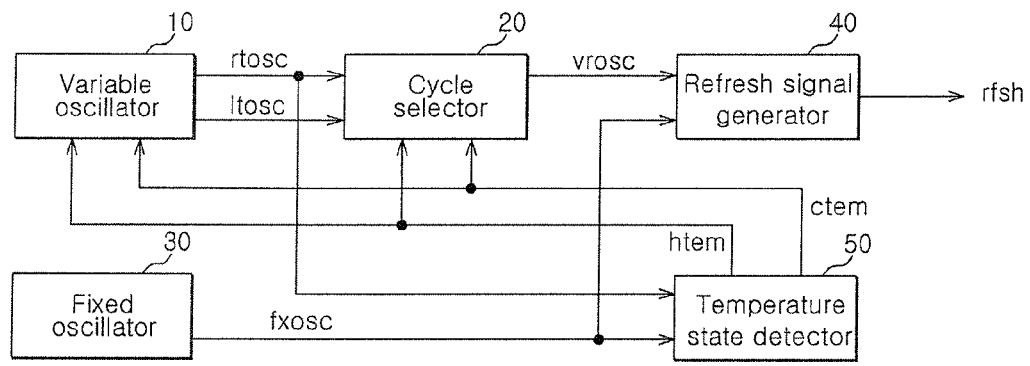
FIG. 1 is a block diagram illustrating a refresh control circuit of a semiconductor memory apparatus according to an aspect of the present invention.

FIG. 1 illustrates a block configuration of a refresh control circuit in a semiconductor memory apparatus according to an aspect of the present invention.

Referring to FIG. 1, the refresh control circuit may be comprised of a variable oscillator 10, a cycle selector 20, a fixed oscillator 30, a refresh signal generator 40, and a temperature state detector 50.

The variable oscillator 10 generates a room-temperature oscillation signal 'rtosc' and a limit-temperature oscillation signal 'ltosc' in response to a hot-temperature state signal 'htem' and a cool-temperature state signal 'ctem'.

The cycle selector 20 outputs a variable oscillation signal 'vrosc' selectively from the room-temperature oscillation signal 'rtosc' and the limit-temperature oscillation signal 'ltosc' in response to the hot-temperature state signal 'htem' and the cool-temperature state signal 'ctem'.

The fixed oscillator 30 generates a fixed oscillation signal 'fxosc'.

The refresh signal generator 40 generates a refresh signal 'rfsh' in response to the variable oscillation signal 'vrosc' and the fixed oscillation signal 'fxosc'.

The temperature state detector 50 detects current temperature in response to the room-temperature oscillation signal 'rtosc' and the fixed oscillation signal 'fxosc' and generates the hot-temperature state signal 'htem' and the cool-temperature state signal 'ctem'.

The room-temperature oscillation signal 'rtosc' operates in a cycle linearly proportional to temperature variation in room temperature. The fixed oscillation signal 'fxosc' operates in a constant cycle independent from temperature variation.

The temperature state detector 50 is able to detect a cycle variation of the room-temperature oscillation signal 'rtosc' with reference to a cycle of the fixed oscillation signal 'fxosc'. From a detected result of cycle variation of the room-temperature oscillation signal 'rtosc', the temperature state detector 50 can determine whether current temperature is in the range of room temperature or limit temperature. If current temperature is detected as being in a hot temperature zone (usually, over 100° C.) higher than room temperature, the temperature state detector 50 activates the hot-temperature state signal 'htem'. If current temperature is detected as being in a cool temperature zone (usually, under 0° C.) lower than room temperature, the temperature state detector 50 activates the cool-temperature state signal 'ctem'. The hot and cool-temperature state signals, 'htem' and 'ctem', are activated in limit temperature zones, i.e., respective to hot and cool temperature zones (over 100° C. and under 0° C.).

If the hot-temperature state signal 'htem' or the cool-temperature state signal 'ctem' is activated, the variable oscillator 10 begins to output the limit-temperature oscillation signal 'ltosc'. While the room-temperature oscillation signal 'rtosc' does not have a linear cycle variation in the limit temperature zones, the limit-temperature oscillation signal 'ltosc' operates in a linear cycle variation in the limit temperature zones.

The cycle selector 20 outputs the room-temperature oscillation signal 'rtosc' as the variable oscillation signal 'vrosc' if the hot and cool-temperature state signals, 'htem' and 'ctem', are all inactivated. If the hot-temperature state signal 'htem' or the cool-temperature state signal 'ctem' is activated, the cycle selector 20 outputs the limit-temperature oscillation signal 'ltosc' as the variable oscillation signal 'vrosc'.

The refresh signal generator 40 compares cycle periods of the fixed oscillation signal 'fxosc' with the variable oscillation signal 'vrosc' and outputs the refresh signal 'rfsh' that is modulated according to the compared result.

In summary, the refresh control circuit according to this aspect of the present invention is able to find that current temperature is in the range of room temperature or limit temperature, and to activate the limit-temperature oscillation signal 'ltosc' if current temperature is found to be in the limit temperature zones. Then, the refresh control circuit generates the refresh signal 'rfsh' by using the limit-temperature oscillation signal 'ltosc' and the fixed oscillation signal 'fxosc'. If current temperature is found to be in the room temperature zone, the refresh control circuit uses the room-temperature oscillation signal 'rtosc' and the fixed oscillation signal 'fxosc' to generate the refresh signal 'rfsh'.

An operation of the refresh control circuit employed in the semiconductor memory apparatus will be described and understood in conjunction with the graph of FIG. 2.

Figure 2:
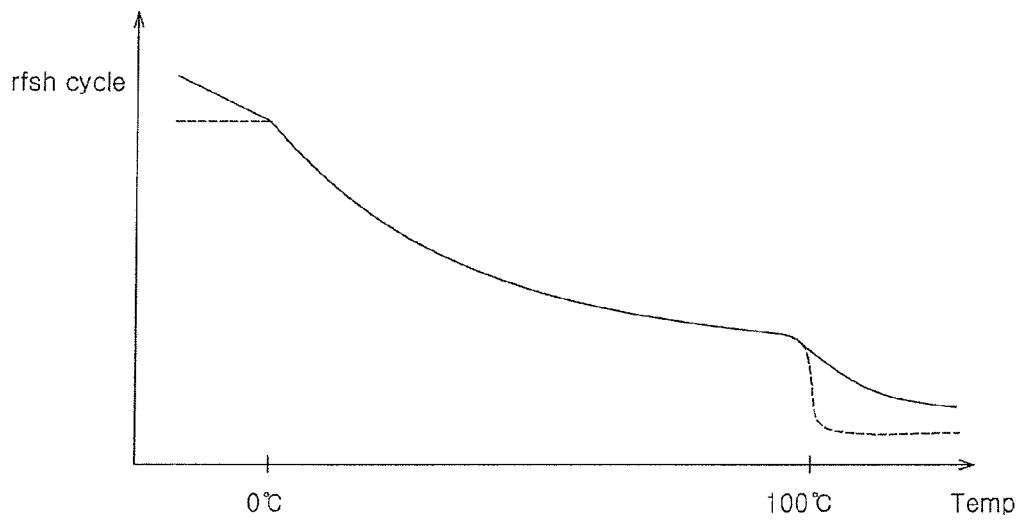
FIG. 2 is a graphic diagram illustrating an operation of the refresh control circuit of the semiconductor memory apparatus shown in FIG. 1.

FIG. 2 graphically illustrates an operation of the refresh control circuit of the semiconductor memory apparatus shown in FIG. 1.

In the graph of FIG. 2, the X-axis represents temperature while the Y-axis represents activation cycles of the refresh signal 'rfsh'. The dotted curves of FIG. 2 plot cycle variations of the refresh signal 'rfsh' when the room-temperature oscillation signal 'rtosc' is transferred to the refresh signal generator 40 as the variable oscillation signal 'vrosc'. The solid curve of FIG. 2 plots a cycle variation of the refresh signal 'rfsh' when the limit-temperature oscillation signal 'ltosc' is transferred to the refresh signal generator 40 as the variable oscillation signal 'vrosc'.

In conventional cases where the room-temperature oscillation signal 'rtosc' is used as the variable oscillation signal 'vrosc' in cool temperatures lower than room temperature and in hot temperatures higher than room temperature, a cycle of the refresh signal 'rfsh' is fixed as the dotted curves. However, the refresh control circuit of the semiconductor memory apparatus according to this aspect linearly adjusts an activation cycle of the refresh signal 'rfsh' even in the limit temperature zones (e.g., over 100° C. or under 0° C.) by utilizing the limit-temperature oscillation signal 'ltosc' when current temperature is in the limit temperature zones out of the range of room temperature (e.g., 0° C.-100° C.). Hence, it is possible to finely control the refresh cycle and reduce unnecessary power consumption.

Figure 3:
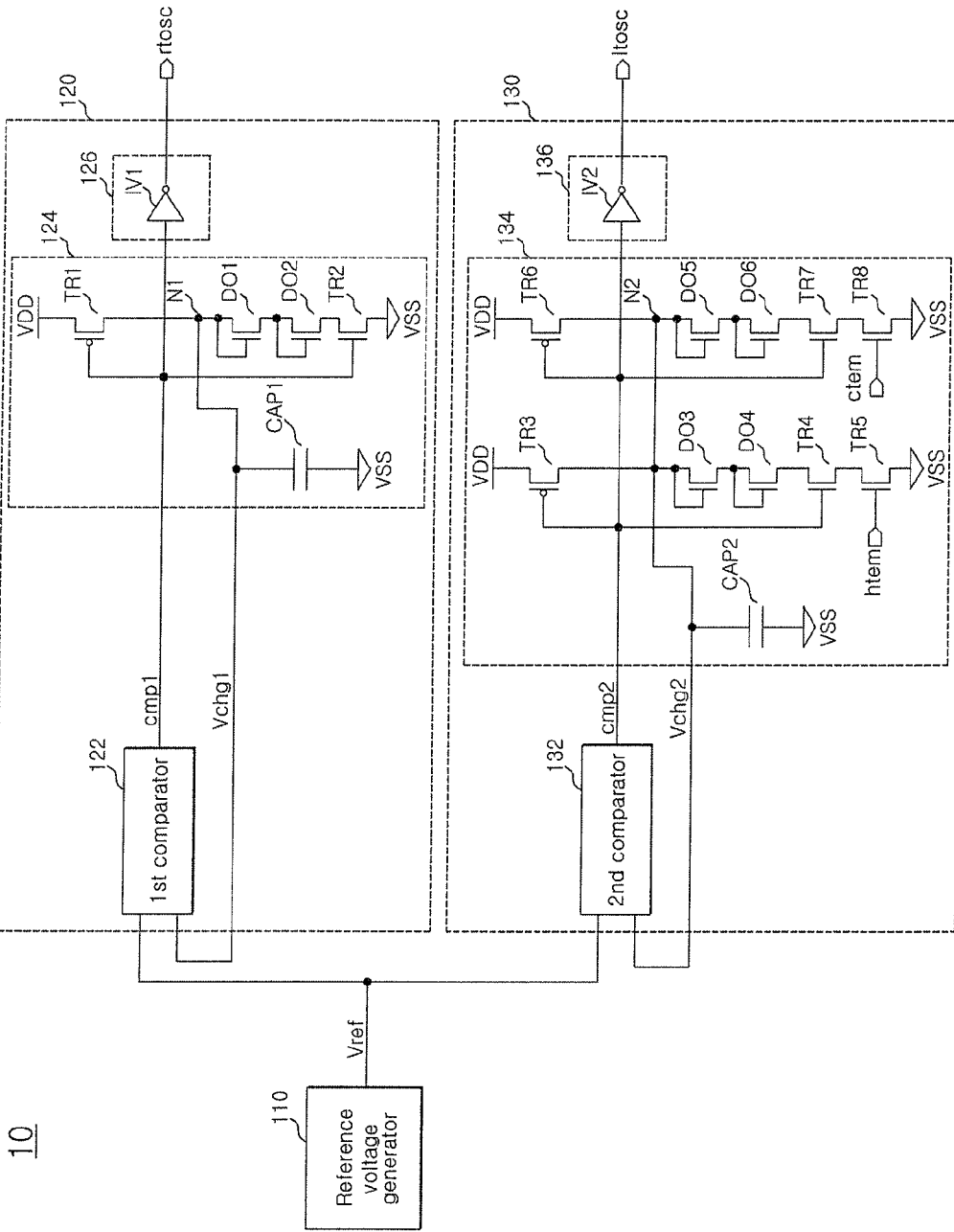
FIG. 3 is a circuit diagram of the variable oscillator shown in FIG. 1.

FIG. 3 illustrates a circuit configuration of the variable oscillator 10 shown in FIG. 1.

Referring to FIG. 3, the variable oscillator 10 may be comprised of a reference voltage generator 110, a room temperature oscillator 120 and a limit temperature oscillator 130.

The reference voltage generator 110 functions to generate a reference voltage 'Vref'. The room temperature oscillator 120 receives the reference voltage 'Vref' and generates the room-temperature oscillation signal 'rtosc'. The limit-temperature oscillator 130 receives the reference voltage 'Vref' and generates the limit-temperature oscillation signal 'ltosc' in response to the hot-temperature state signal 'htem' and the cool-temperature state signal 'ctem'.

The room-temperature oscillator 120 may be comprised of a first comparator 122 which generates a first compared signal 'cmp1' by comparing the potential levels of a first charge voltage 'Vchg1' with the reference voltage 'Vref'; a first charge/discharge circuit 124 generating the first charge voltage 'Vchg1' through a charging or discharging operation in response to the first compared signal 'cmp1'; and a first driver 126 generating the room-temperature oscillation signal 'rtosc' by driving the first compared signal 'cmp1'.

The limit-temperature oscillator 130 may be comprised of a second comparator 132 generating a second compared signal 'cmp2' by comparing the potential levels of a second charge voltage 'Vchg2' with the reference voltage 'Vref'; a second charge/discharge circuit 134 generating the second charge voltage 'Vchg2' through a charging or discharging operation in response to the second compared signal 'cmp2', the hot-temperature state signal 'htem' and the cool-temperature state signal 'ctem'; and a second driver 136 generating the limit-temperature oscillation signal 'ltosc' by driving the second compared signal 'cmp2'.

The reference voltage generator 110 may be implemented by use of a Widlar circuit generally well-known in the art. The reference voltage 'Vref' provided from the reference voltage generator 110 can be substantially retained on a constant level even with temperature variations.

The first comparator 122 of the room-temperature oscillator 120, or the second comparator 132 of the limit-temperature oscillator 130, may be implemented by use of a differential amplifier circuit. The first comparator 122 outputs the first compared signal 'cmp1' of high level if the first charge voltage 'Vchg1' is higher than the first reference voltage 'Vref'. The first compared signal 'cmp1' is output in a low level if the first charge voltage 'Vchg1' is lower than the first reference voltage 'Vref'. The second comparator 132 outputs the second compared signal 'cmp2' of high level if the second charge voltage 'Vchg2' is higher than the first reference voltage 'Vref'. The second compared signal 'cmp2' is output in a low level if the second charge voltage 'Vchg2' is lower than the first reference voltage 'Vref'.

The first charge/discharge circuit 124 may be comprised of: a first transistor TR1 with a gate to which the first compared signal 'cmp1' is input, a source to which the external power voltage VDD is supplied, and a drain coupled to a first node N1; a second transistor TR2 with a gate to which the first compared signal 'cmp1' is input, and a source that is grounded; first and second diodes DO1 and DO2 serially coupled between the first node N1 and the drain of the second transistor TR2; and a first capacitor CAP1 coupled between the first node N1 and the ground terminal.

The first driver 126 includes an inverter IV1 for inversely driving the first compared signal 'cmp1' and outputting the room-temperature oscillation signal 'rtosc'.

With this configuration, the first charge/discharge circuit 124 discharges charges from the first capacitor CAP1 through the first and second diodes DO1 and DO2 and the second transistor TR2 if the first compared signal 'cmp1' is high level in potential. Meanwhile, the room-temperature oscillation signal 'rtosc' stays at a low level. After a predetermined time, the first compared signal 'cmp1' goes to a low level if the first charge voltage 'Vchg1' becomes lower than the first reference voltage 'Vref'. Then, the first charge/discharge circuit 124 turns the first transistor TR1 on to charge the first capacitor CAP1. During this, the room-temperature oscillation signal 'rtosc' becomes a high level. The first charge/discharge circuit 124 continues the charging operation just until the first charge voltage 'Vchg1' rises up to be higher than the reference voltage 'Vref' and the first compared signal 'cmp1' reaches a high level.

Through repetition of the aforementioned operation, the room-temperature oscillation signal 'rtosc' is reduced to a form of pulse oscillating (i.e., toggling) signal with a predetermined cycle. A cycle of the room-temperature oscillation signal 'rtosc' is determined by the capacitance of the first capacitor CAP1 and resistance of the diodes DO1 and DO2.

The second charge/discharge circuit 134 may be comprised of: a third transistor TR3 with a gate to which the second compared signal 'cmp2' is input, a source to which the external power voltage VDD is supplied, and a drain coupled to a second node N2; a fourth transistor TR4 with a gate to which the second compared signal 'cmp2' is input; third and fourth diodes DO3 and DO4 serially coupled between the second node N2 and a drain of the fourth transistor TR4; a fifth transistor TR5 with a gate to which the hot-temperature state signal 'htem' is input, a drain coupled to a source of the fourth transistor TR4, and a source that is grounded; a sixth transistor TR6 with a gate to which the second compared signal 'cmp2' is input, a source to which the external power voltage VDD is supplied, and a drain coupled to the second node N2; a seventh transistor TR7 with a gate to which the second compared signal 'cmp2' is input; fifth and sixth diodes DO5 and DO6 serially coupled between the second node N2 and a drain of the seventh transistor TR7; an eighth transistor TR8 with a gate to which the cool-temperature state signal 'ctem' is input, a drain coupled to a source of the second transistor TR7, and a source that is grounded; and a second capacitor CAP2 coupled between the second node N2 and the ground terminal.

The second driver 136 includes a second inverter IV2 for inversely driving the second compared signal 'cmp2' and outputting the limit-temperature oscillation signal 'ltosc'.

In this aspect, the third through sixth diodes DO3-DO6 of the second charge/discharge circuit 134 are designed to be larger than the first and second diodes DO1 and DO2 of the first charge/discharge circuit 124 in size. The diodes DO1-DO6 may be made up of gate-drain coupled MOS transistors as shown in FIG. 3. In this case, each of the diodes DO1-DO6 has a resistive value corresponding to a gate length.

With this configuration, the limit temperature oscillator 130 is disabled in operation if the hot and cool-temperature state signals 'htem' and 'ctem' are all inactivated. If the hot-temperature state signal 'htem' or the cool-temperature state signal 'ctem' is activated, the fifth transistor TR5 or the eighth transistor TR8 of the second charge/discharge circuit 134 is turned on and the limit temperature oscillator 130 operates similar to the room temperature oscillator 120. As the third and fourth diodes DO3 and DO4, or the fifth and sixth diodes DO5 and DO6, of the second charge/discharge circuit 134 have larger resistance values than the first and second diodes DO1 and DO2 of the first charge/discharge circuit 124, the second node N2 is slower than the first node N1 in voltage drop. Thus, the activation cycle of the limit-temperature oscillation signal 'ltosc' is longer than the activation cycle of the room-temperature oscillation signal 'rtosc'.

Figure 4:
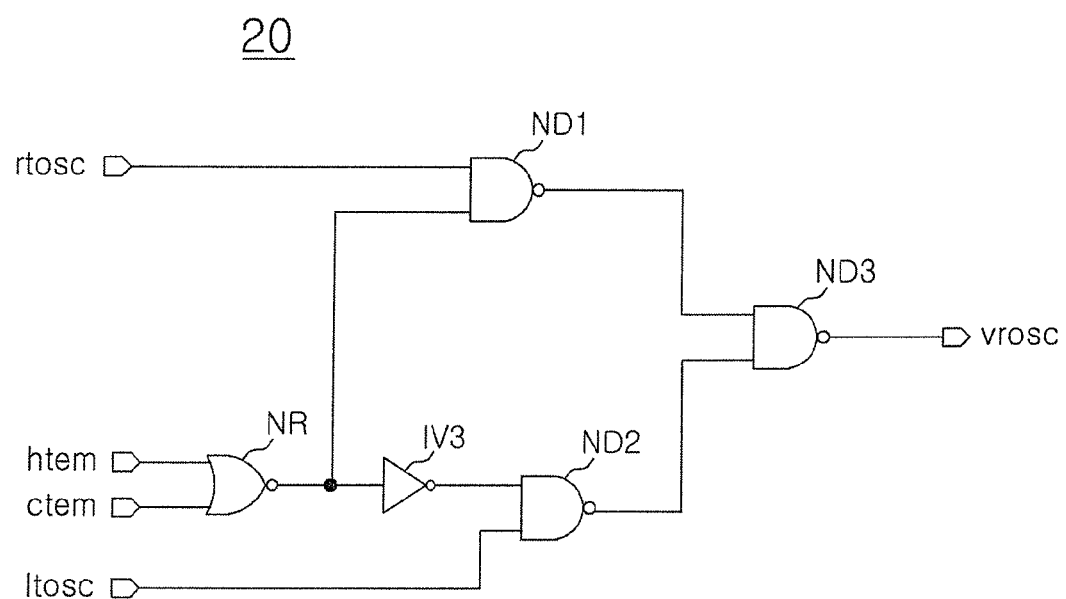
FIG. 4 is a circuit diagram of the cycle selector shown in FIG. 1.

FIG. 4 illustrates a circuit of the cycle selector 20 shown in FIG. 1.

Referring to FIG. 4, the cycle selector 20 may be comprised of: a NOR gate NR receiving hot and cool-temperature state signals 'htem' and 'ctem'; a first NAND gate ND1 receiving a room-temperature oscillation signal 'rtosc' and an output signal of the NOR gate NR; a third inverter IV3 receiving the output signal of the NOR gate NR; a second NAND gate ND2 receiving an output signal of the third inverter IV3 and a limit-temperature oscillation signal 'ltosc'; and a third NAND gate ND3 receiving output signals of the first and second NAND gates ND1 and ND2 and outputting a variable oscillation signal 'vrosc'.

With this configuration, the variable oscillation signal 'vrosc' is generated as a non-inverted signal driven from the room-temperature oscillation signal 'rtosc' if the current temperature at room temperature, i.e., if the hot and cool-temperature state signals 'htem' and 'ctem' are inactivated. Contrarily, if current temperature is in the limit temperature zones outside of room temperature, i.e., if the hot-temperature state signal 'htem' or the cool-temperature state signal 'ctem' is activated, the variable oscillation signal 'vrosc' is generated as a non-inverted signal driven from the limit-temperature oscillation signal 'ltosc'.

As described above, the refresh control circuit of the semiconductor memory apparatus according to the present invention is able to generate a refresh signal that linearly varies in cycle to temperature variation even when current temperature is in the limit temperature zones. This provides fine adjustments to a cycle of the refresh operation (i.e., a refresh cycle) independent of current temperature. Further, it is possible to reduce unnecessary current consumption that is caused by fixing the refresh cycle at constants in the limit temperature zones. As a result, data retention is improved in the semiconductor memory apparatus.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A refresh control circuit of a semiconductor memory apparatus, comprising:
a variable oscillator configured to generate a room-temperature oscillation signal and a limit-temperature oscillation signal in response to a temperature state signal;
a cycle selector configured to selectively output the room-temperature oscillation signal or the limit-temperature oscillation signal as a variable oscillation signal in response to the temperature state signal;

a refresh signal generator configured to generate a refresh signal in response to the variable oscillation signal and a fixed oscillation signal; and a temperature state detector configured to generate the temperature state signal by detecting current temperature in response to the room-temperature oscillation signal and the fixed oscillation signal.

2. The refresh control circuit according to claim 1, wherein the temperature state signal comprises: a hot-temperature state signal activated in a limit hot temperature zone; and a cool-temperature state signal activated in a limit cool temperature zone.

3. The refresh control circuit according to claim 1, wherein the room-temperature oscillation signal operates in a cycle linearly depending on variations of room temperature and the fixed oscillation signal operates in a fixed cycle independent from temperature variation.

4. The refresh control circuit according to claim 2, wherein the variable oscillator is configured to oscillate the limit-temperature oscillation signal in a linear cycle variation if the hot or cool-temperature state signal is activated.

5. The refresh control circuit according to claim 4, wherein the variable oscillator comprises:
   a reference voltage generator configured to generate a reference voltage;
   a room temperature oscillator configured to receive the reference voltage and to generate the room-temperature oscillation signal; and
   a limit temperature oscillator configured to receive the reference voltage and to generate the limit-temperature oscillation signal in response to the hot and cool-temperature state signals.

6. The refresh control circuit according to claim 5, wherein the room temperature oscillator comprises:
   a first comparator configured to generate a first compared signal by comparing a first charge voltage with the reference voltage;
   a first charge/discharge circuit configured to generate the first charge voltage through a charging or discharging operation in response to the first compared signal; and
   a first driver configured to generate the room-temperature oscillation signal by driving the first compared signal.

7. The refresh control circuit according to claim 6, wherein the limit temperature oscillator comprises:
   a second comparator configured to generate a second compared signal by comparing a second charge voltage with the reference voltage;
   a second charge/discharge circuit configured to generate the second charge voltage in response to the hot and cool-temperature state signals; and
   a second driver configured to generate the limit-temperature oscillation signal by driving the second compared signal.

8. The refresh control circuit according to claim 7, wherein the first and second charge/discharge circuits comprise diodes respectively on discharge paths of the first and second charge voltages, wherein the second charge/discharge circuit has a larger diode resistance than the first charge/discharge circuit.

9. The refresh control circuit according to claim 2, wherein the cycle selector is configured to output the room-temperature oscillation signal as the variable oscillation signal if the hot and cool-temperature state signals are inactivated, and to output the limit-temperature oscillation signal as the variable oscillation signal if the hot or cool-temperature state signal is activated.

10. The refresh control circuit according to claim 2, wherein the temperature state detector configured to detect a cycle variation of the room-temperature oscillation signal with reference to a cycle of the fixed oscillation signal, activating the hot-temperature state signal if current temperature is over room temperature and activating the cool-temperature state signal if current temperature is under the room temperature.

11. A refresh control method of a semiconductor memory apparatus, the method is comprised of:
    determining whether current temperature is in a room temperature or in a limit temperature zone;
    oscillating a limit-temperature oscillation signal in a linear cycle variation if current temperature is in the limit temperature zone; and
    generating a refresh signal by means of the limit-temperature oscillation signal and a fixed oscillation signal.

12. The method according to claim 11, wherein determining whether current temperature is in the room temperature or in the limit temperature zone is comprised of: generating a room-temperature oscillation signal and the fixed oscillation signal and deciding a current temperature state by detecting a cycle variation of the room-temperature oscillation signal with reference to a cycle of the fixed oscillation signal.

13. The method according to claim 12, wherein: the room-temperature oscillation signal operates in a cycle linearly depending on variation of room temperature; the fixed oscillation signal operates in a fixed cycle independent from temperature variation; and the limit-temperature oscillation signal operates in a cycle linearly depending on variation in the limit temperature zone.

14. The method according to claim 12, wherein oscillating the limit-temperature oscillation signal is comprised of: inactivating the limit-temperature oscillation signal if current temperature is detected to be in room temperature.

15. The method according to claim 14, wherein generating the refresh signal is comprised of: generating the refresh signal by means of the room-temperature oscillation signal and the fixed oscillation signal if current temperature is detected to be in room temperature.

* * * * *